United States Patent
Umise et al.

(10) Patent No.: US 10,381,258 B2
(45) Date of Patent: Aug. 13, 2019

(54) APPARATUS OF PROCESSING WORKPIECE IN DEPRESSURIZED SPACE

(71) Applicant: TOKYO ELECTRON LIMITED, Tokyo (JP)

(72) Inventors: Takuya Umise, Nirasaki (JP); Hiroshi Sone, Nirasaki (JP); Naoyuki Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 262 days.

(21) Appl. No.: 15/363,141

(22) Filed: Nov. 29, 2016

(65) Prior Publication Data

US 2017/0162424 A1 Jun. 8, 2017

(30) Foreign Application Priority Data

Dec. 2, 2015 (JP) .................................. 2015-235652
Mar. 4, 2016 (JP) .................................. 2016-042020

(51) Int. Cl.
*H01L 21/687* (2006.01)

(52) U.S. Cl.
CPC .............................. *H01L 21/68742* (2013.01)

(58) Field of Classification Search
CPC .............................................. H01L 21/68742
See application file for complete search history.

(56) References Cited

U.S. PATENT DOCUMENTS

| | | | | |
|---|---|---|---|---|
| 6,120,609 A | * | 9/2000 | Selyutin | C23C 16/4583 118/500 |
| 8,757,603 B2 | * | 6/2014 | Willwerth | H01L 21/68742 269/21 |
| 9,921,490 B2 | * | 3/2018 | Shibazaki | H01L 21/68742 |
| 2005/0034674 A1 | * | 2/2005 | Ono | H01L 21/6831 118/728 |
| 2006/0156987 A1 | * | 7/2006 | Lai | C23C 16/4586 118/728 |
| 2009/0065486 A1 | * | 3/2009 | Yamashita | H01J 37/20 219/121.58 |
| 2012/0097908 A1 | | 4/2012 | Willwerth et al. | |
| 2017/0032997 A1 | * | 2/2017 | Willwerth | H01L 21/68742 |
| 2017/0301579 A1 | * | 10/2017 | Hosaka | H01L 21/31116 |

FOREIGN PATENT DOCUMENTS

| | | |
|---|---|---|
| CN | 1777986 A | 5/2006 |
| JP | 9-13172 A | 1/1997 |

* cited by examiner

*Primary Examiner* — Mark C Hageman
(74) *Attorney, Agent, or Firm* — Nath, Goldberg & Meyer; Jerald L. Meyer

(57) ABSTRACT

In a processing apparatus according to one embodiment, a stage is installed inside a process chamber. The stage has a plurality of through-holes formed therein, which corresponds to a plurality of lift pins. The plurality of lift pins is supported by a spline shaft through a support body. The spline shaft is supported by a spline bearing such that the spline shaft is vertically moved. The plurality of lift pins is biased upward by a spring member through the spline shaft. The spline shaft, the spline bearing, and the spring member are installed in an outer space separated from a depressurizable inner space of the process chamber.

13 Claims, 7 Drawing Sheets

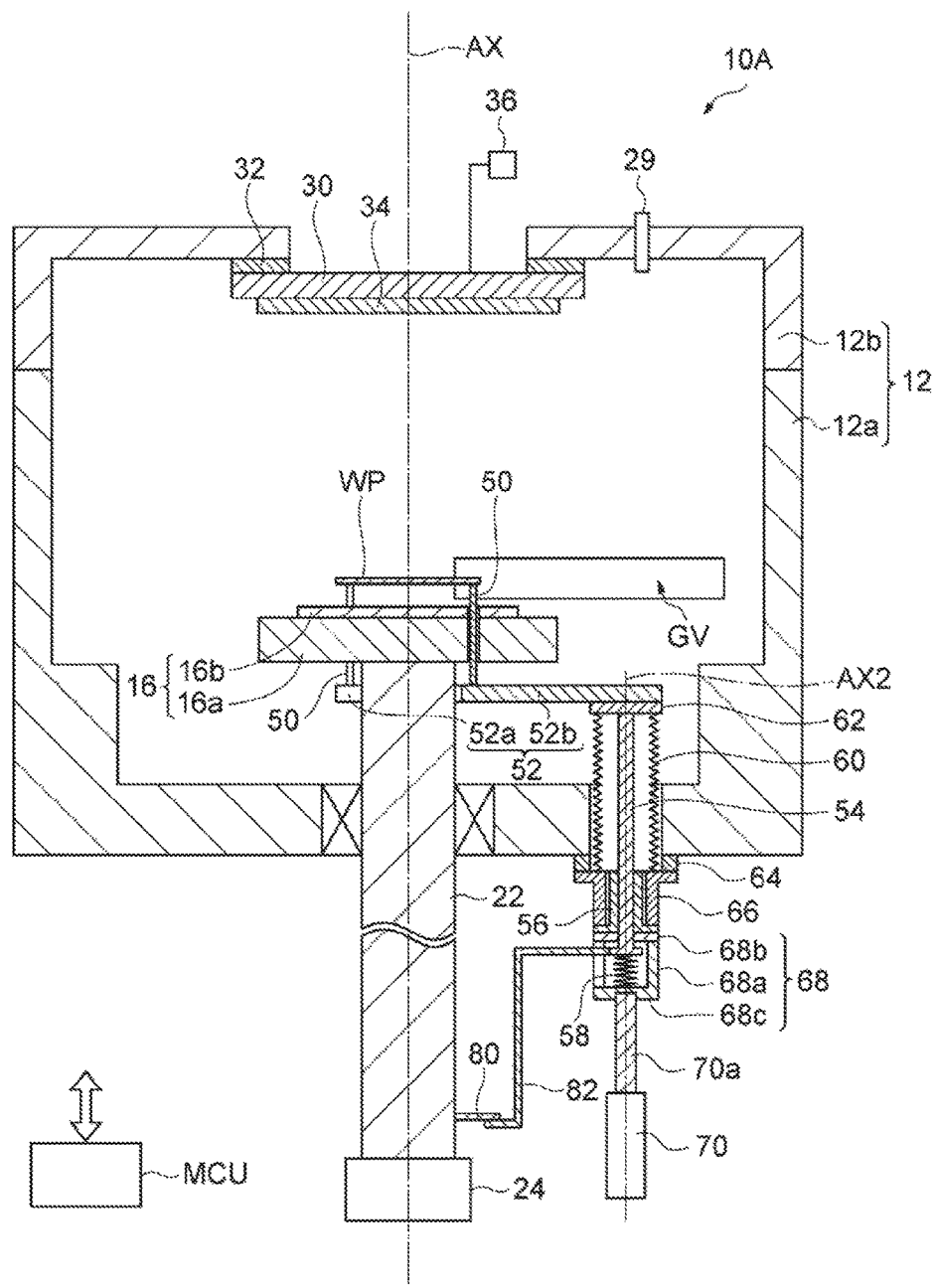

APPARATUS OF PROCESSING WORKPIECE IN DEPRESSURIZED SPACE

CROSS-REFERENCE TO RELATED APPLICATIONS

This application claims the benefit of Japanese Patent Application No. 2015-235652, filed on Dec. 2, 2015 and Japanese Patent Application No. 2016-042020, filed on Mar. 4, 2016, in the Japan Patent Office, the disclosures of which are incorporated herein in their entirety by reference.

TECHNICAL FIELD

Embodiments o present disclosure relate to an apparatus of processing a workpiece in a depressurized space.

BACKGROUND

When manufacturing an electronic device, various processes are performed with respect to a workpiece such as a semiconductor substrate. Examples of such a process may include a process performed under a depressurized environment, for example, a film forming process, an etching process or the like.

In processing a workpiece under a depressurized environment, a processing apparatus provided with a process chamber having a depressurizable inner space is used. Typically, such a processing apparatus is further provided with a stage and a plurality of lift pins. The stage is to support a workpiece mounted thereon and has a plurality of through-holes formed therein. The lift pins are configured to be inserted into the plurality of through-holes, respectively. In the processing apparatus, the workpiece is loaded into the process chamber by a transfer device such as a transfer robot. The workpiece loaded into the process chamber is transferred from the transfer device onto upper ends of the plurality of lift pins which protrude from an upper surface of the stage. Thereafter, the workpiece is transferred from the plurality of lift pins onto the stage. Subsequently, the workpiece is subjected to a process.

In such a processing apparatus, relative positions between the upper ends of the plurality of lift pins and the upper surface of the stage are set with a vertical movement of the stage. In the processing apparatus, the stage is configured to be vertically movable. The stage has a plurality of through-holes formed therein. The plurality of lift pins is partially inserted into the plurality of through-holes, respectively, and is supported by the stage. Under the plurality of lift pins, a plurality of pin bearings supported respectively by a plurality of springs, is installed.

In the processing apparatus, the stage is moved downward such that lower ends of the plurality of lift pins are brought into contact with the plurality of pin bearings, respectively. Thus, the upper ends of the plurality of lift pins are located above the upper surface of the stage. Thereafter, a workpiece is transferred onto the upper ends of the plurality of lift pins. Subsequently, the stage is moved upward such that the plurality of lift pins is moved below the upper surface of the stage. In this way, the workpiece is mounted on the stage.

In the conventional processing apparatus, when the plurality of lift pins moves relative to the stage, the plurality of lift pins slides along a wall surface of the stage, Which defines the plurality of through-holes. As such, particles are likely to be generated from at least one of the stage and the lift pins. Such particles may also be generated from the springs. In addition, for the movement of the plurality of lift pins with respect to the stage, clearance (gaps) is required between the plurality of lift pins and the wall surface of the stage defining the plurality of through-holes, respectively. Thus, when the plurality of lift pins move relative to the stage, the plurality of lift pins is likely to clatter. This deteriorates accuracy of transferring the workpiece onto the stage.

SUMMARY

Some embodiments of the present disclosure provide a processing apparatus capable of suppressing generation of particles, which is caused by moving a plurality of lift pins relative to a stage of the processing apparatus, while improving accuracy of transferring a workpiece onto the stage.

According to one embodiment of the present disclosure, there is provided an apparatus of processing a workpiece in a depressurized space, including: a process chamber having a depressurizable inner space; a stage configured to be vertically movable inside the process chamber and having a plurality of through-holes formed to penetrate from an upper surface up to a lower surface thereof; a support body installed under the stage; a plurality of lift pins supported by the support body and extending upward from the support body, the plurality of lift pins being aligned with the plurality of through-holes, respectively, in a vertical direction; a spline shaft configured to extend in the vertical direction and supporting the support body thereon; a spline bearing configured to support the spline shaft such that the spline shaft is vertically moved; a spring member configured to bias the spline shaft upward; a vertically-extendible bellows configured to surround the spline shaft inside the process chamber and isolate the depressurizable inner space of the process chamber from an outer space of the process chamber including an inner space of the bellows; a restriction mechanism configured to restrict an upward movement of the plurality of lift pins from the upper surface of the stage, when an upper end of each of the plurality of lift pins protrudes from the upper surface of the stage; and a limiting part configured to limit an upward movement of the spline shaft when the stage is located at at least a predetermined position in the vertical direction or above the predetermined position, wherein the spline shaft, the spline bearing, and the spring member are installed in the outer space of the process chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a schematic view of a processing apparatus according to another embodiment.

DETAILED DESCRIPTION

Figure 1:
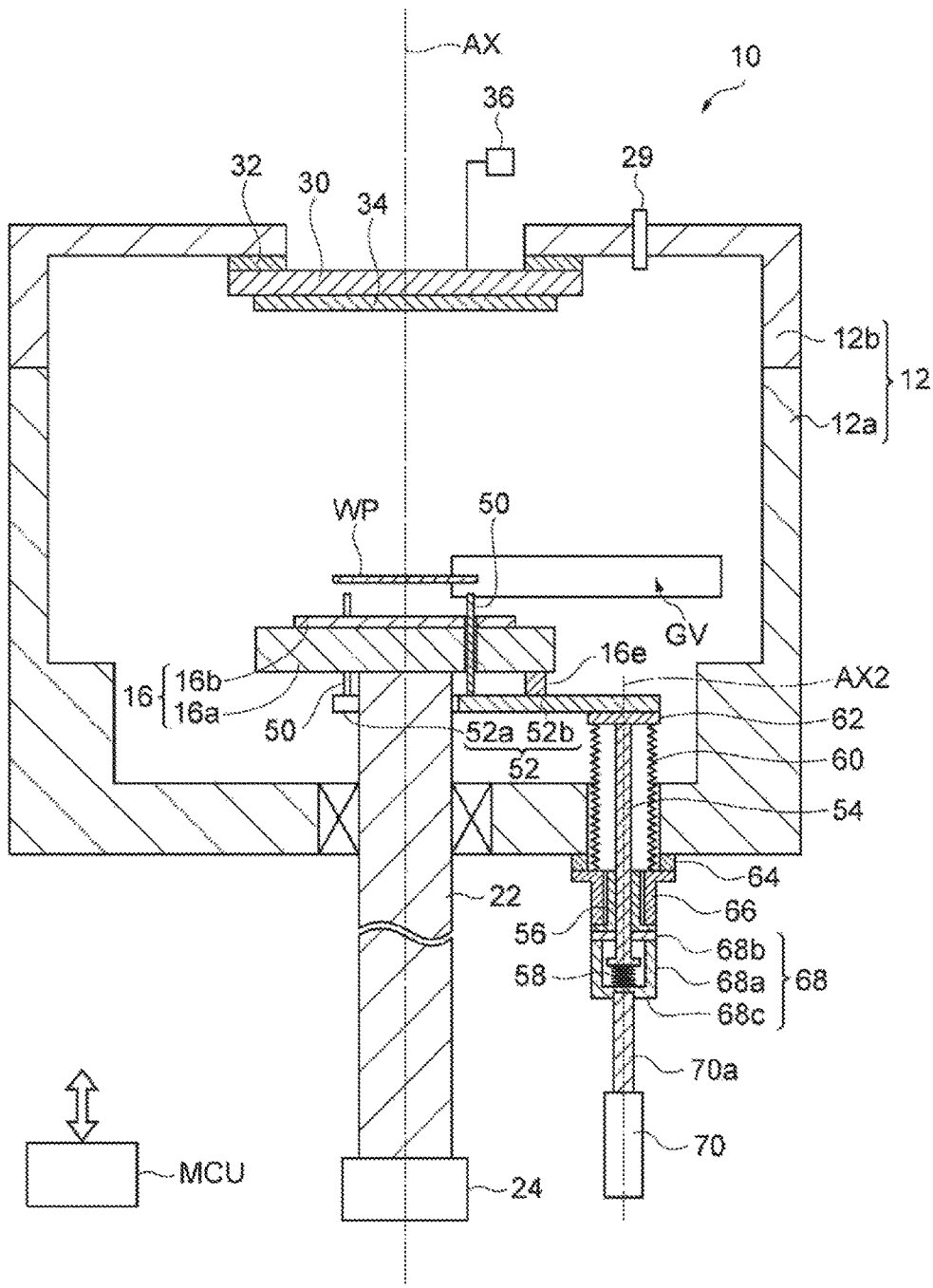
FIG. 1 is a schematic view of a processing apparatus according to one embodiment.

Reference will now be made in detail to various embodiments, examples of which are illustrated in the accompanying drawings. In the drawings, like reference numerals will be assigned to like parts. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a schematic view of a processing apparatus according to one embodiment. Referring to FIG. 1, a processing apparatus 10 is configured as a film formation apparatus. The processing apparatus 10 includes a process chamber 12. The process chamber 12 has a depressurizable inner space. The inner space of the process chamber 12 can be depressurized by an exhaust device. The process chamber 12 includes a main body 12a and a cover 12b. The main body 12a has a substantially tubular shape and has an open upper end. In one embodiment, the main body 12a has a substantially cylindrical shape. A central axis of the main body 12a is in line with an axis line AX. An opening through which a workpiece WP is transferred is formed in a sidewall of the main body 12a, i.e. a sidewall of the process chamber 12. This opening is opened or closed by a gate valve GV. The cover 12b is installed on the main body 12a. An opening formed in an upper end of the main body 12a is closed by the cover 12b, and a holder 30 and a holder support part 32, which will be described later.

The process chamber 12 is provided therein with a stage 16. The stage 16 includes a base 16a and an electrostatic chuck 16b. In one embodiment, the stage 16 further includes a convex portion 16e. The base 16a has a substantially disc shape. The base 16a serves as a lower surface of the stage 16. The convex portion 16e is fixed to the base 16a and extends downward from the base 16a. The electrostatic chuck 16b is installed on the base 16a. The electrostatic chuck 16b has a substantially disc shape. The center of the electrostatic chuck 16b is approximately located on the axis line AX. The electrostatic chuck 16b generates electrostatic force based on voltage applied from a power supply installed outside the process chamber 12 and electrostatically adsorbs the workpiece WP by the electrostatic force, An upper surface of the electrostatic chuck 16b, on which the workpiece WP is mounted, constitutes an upper surface of the stage 16.

A shaft 22 is coupled to the base 16a. The shaft 22 extends downward from the base 16a. The shaft 22 extends outside the process chamber 12 through a bottom of the process chamber 12. A seal mechanism is installed between the shaft 22 and the bottom of the main body 12a of the process chamber 12 to hermetically seal the inner space of the process chamber 12. A central axis of the shaft 22 is substantially in line with the axis line AX.

The shaft 22 is connected to a drive device 24 installed outside the process chamber 12. The drive device 24 rotates the shaft 22 around the central axis of the shaft 22 and vertically moves the shaft 22. When the workpiece WP is mounted on the stage 16, the drive device 24 locates the stage 16 at a relatively low position inside the process chamber 12. The workpiece WP transferred into the process chamber 12 by a transfer device is adsorbed to the electrostatic chuck 16b. Subsequently, the drive device 24 moves the stage 16 upward to form a film on the workpiece WP.

The processing apparatus 10 further includes a gas supply part 29. The gas supply part 29 is configured to supply a gas to the inner space of the process chamber 12. Further, the processing apparatus 10 includes the holder 30 and the holder support part 32. The holder support part 32 is formed of an insulator and is attached to the cover 12b, The holder support part 32 supports the holder 30 and electrically insulates the holder 30 from the cover 12b. The holder 30 holds a target 34. In addition, a power supply 36 is connected to the holder 30. When the power supply 36 applies voltage to the holder 30, an electric field is generated in the vicinity of the target 34. By virtue of the electric field, the gas supplied from the gas supply part 29 is dissociated to generate ions. The generated ions collide with the target 34 so that a substance is emitted from the target 34. The emitted substance is deposited on the workpiece WP.

Figure 2:
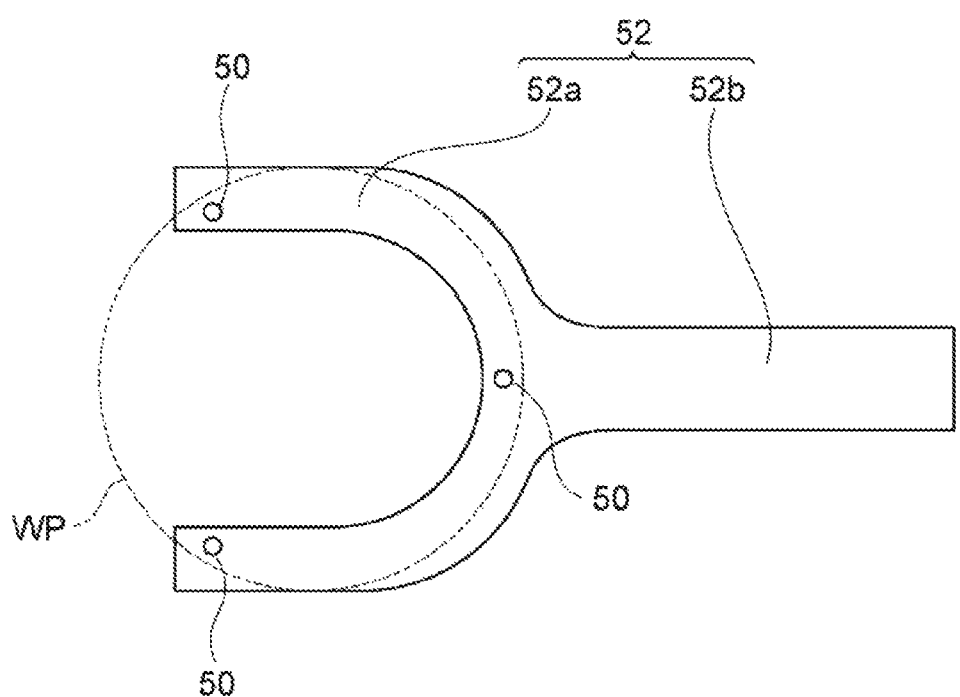
FIG. 2 is a plan view of a plurality of lift pins and a support body included in a lift mechanism of the processing apparatus of FIG. 1.

Next, the stage 16 and a lift mechanism used in transferring the workpiece WP will be described in detail with reference to FIGS. 1 and 2. FIG. 2 is a plan view of a plurality of lift pins and a support body included in a lift mechanism of the processing apparatus 10 shown in FIG. 1.

A plurality of through-holes 16h (see FIGS. 5 and 6) is formed in the stage 16. The plurality of through-holes 16h extend from the lower surface of the stage 16 up to the upper surface thereof. For example, the plurality of through-holes 16h may have a circular cross-section. The plurality of through-holes 16h are arranged in a circumferential direction with respect to the axis line AX. The plurality of through-holes 16h may be formed at any locations as long as they support the workpiece WP by upper ends of a plurality of lift pins 50 protruding from the upper surface of the stage 16 through the through-holes 16h. The number of through-holes 16h may be any number greater than or equal to three.

The lift mechanism of the processing apparatus 10 includes the plurality of lift pins 50, a support part 52, a spline shaft 54, a spline bearing 56, a spring member 58, and a bellows 60. Each of the plurality of lift pins 50 has a vertically-extended column shape, for example, a columnar shape. The width (for example, diameter) of each of the plurality of lift pins 50 is smaller than the width (for example, diameter) of each of the through-holes 16h such that the lift pin 50 is not brought into contact with a wall surface defining the through-hole 16h of the stage 16. In addition, the number of the plurality of lift pins 50 of the processing apparatus 10 is the same as the number of the through-holes 16h.

The plurality of lift pins 50 is supported by the support part 52. The plurality of lift pins 50 extends upward from the support part 52 and is aligned with the respective through-holes 16h in the vertical direction. The support part 52 is installed under the stage 16. In one embodiment, the support part 52 may be brought into contact with a lower end of the convex portion 16e of the stage 16. In addition, the combination of the convex portion 16e of the stage 16 and the support part 52 constitute a restriction mechanism according to one embodiment.

In one embodiment, the support part 52 includes a first portion 52a and a second portion 52b. The first portion 52a has, for example, a horseshoe shape (or a U-like shape). That is to say, the first portion 52a includes a base and two arms extending from the base. The first portion 52a is installed around the shaft 22. The plurality of lift pins 50 is supported by the first portion 52a and extends upward from the first portion 52a. The plurality of lift pins 50 are arranged on the first portion 52a such that the central axes of the plurality of lift pins 50 are substantially in line with center lines of the through-holes 16h, respectively.

The second portion 52b extends from the base of the first portion 52a toward the sidewall of the process chamber 12. In addition, the second portion 52b passes through a position wider the convex portion 16e of the stage 16 and extends toward the sidewall of the process chamber 12. That is to say, the lower end of the convex portion 16e may be brought into contact with the second portion 52b. When the lower end of the convex portion 16e is in contact with the second portion 52b, the plurality of lift pins 50 are partially located inside the plurality of through-holes 16h, respectively. In addition, the upper ends of the plurality of lift pins 50 protrude upward from the upper surface of the stage 16. Thus, the degree to which the upper ends of the plurality of lift pins 50 protrude from the upper surface of the stage 16 is determined by the convex portion 16e. When the lower end of the convex portion 16e is brought into contact with the second portion 52b of the support part 52 in a state where the upper end of each of the plurality of lift pins 50 protrudes from the upper surface of the stage 16, upward movement of the plurality of lift pins 50 from the upper surface of the stage 16 is restricted.

The spline shaft 54 extends in the vertical direction. The central axis of the spline shaft 54 is parallel to the axis line AX and is substantially in line with the axis line AX2. The axis line AX2 is closer to the sidewall of the process chamber 12 than the axis line AX. The spline shaft 54 supports the support part 52 from below. In one embodiment, a plate-shaped member 62 is fixed to a lower surface of the second portion 52b of the support part 52. An upper end portion of the spline shaft 54 is directly coupled to the member 62 and is coupled to the second portion 52b through the member 62. In one embodiment, the spline shaft 54 extends outward of the process chamber 12 through an opening formed in the bottom of the process chamber 12.

The spline bearing 56 supports the spline shaft 54 such that the spline shaft 54 can be vertically moved. In one embodiment, the spline bearing 56 is installed outside the process chamber 12. The spline bearing 56 is fixed to the bottom of the main body 12a of the process chamber 12. In one embodiment, the spline bearing 56 is fixed to the bottom of the main body 12a of the process chamber 12 through a member 64 and a member 66. The member 64 has an annular plate shape and is fixed to a lower surface of the bottom of the main body 12a of the process chamber 12. The member 66 has a substantially cylindrical shape and has a flange formed at an upper end portion thereof. The member 66 is installed under the member 64. The upper end portion of the member 66 is coupled to the member 64. The spline bearing 56 is partially installed inside an inner opening of the member 66. A lower end portion of the spline bearing 56 is coupled to a lower end portion of the member 66.

The spring member 58 is installed to bias the spline shaft 54 upward. The spring member 58 may be, for example, a coil spring. In one embodiment, the processing apparatus 10 further includes a housing 68. The housing 68 receives the spring member 58 therein. The housing 68 includes a housing body 68a and a cover 68b. The housing body 68a has a substantially cylindrical shape, of which an upper end is opened. The cover 68b is installed on an upper end of the housing body 68a and is fixed to the housing body 68a. The cover 68b constitutes an upper portion of the housing 68. In addition, a bottom of the housing body 68a extends below the cover 68b and constitutes a lower portion 68c of the housing 68.

The cover 68b has an opening. The spline shaft 54 extends into the housing 68 through the opening of the cover 68b. That is to say, the lower end portion of the spline shaft 54 is received in the housing 68. The lower end portion of the spline shaft 54 includes a flange. The spring member 58 is installed between the lower end portion of the spline shaft 54 and the lower portion of the housing 68, i.e. the bottom of the housing body 68a. An upper end of the spring member 58 is fixed to the lower end portion of the spline shaft 54. In addition, a lower end of the spring member 58 is fixed to the lower portion of the housing 68.

The upper portion of the housing 68, i.e. the cover 68b, provides a surface facing an upper surface of the flange of the lower end portion of the spline shaft 54. The cover 68b constitutes a limiting part configured to limit an upward movement of the spline shaft 54. Specifically, the limiting part is configured to limit the upward movement of the spline shaft 54 when the stage 16 is located at a predetermined position in the vertical direction and above the predetermined position. Here, the predetermined position may be a position at which the workpiece WP is brought into contact with the upper surface of the stage 16.

The bellows 60 is extendable in the vertical direction. The bellows 60 is installed to surround the spline shaft 54 inside the process chamber 12. The bellows 60 separates the depressurizable inner space of the process chamber 12 from a space outside the process chamber 12 including an inner space of the bellows 60. In one embodiment, an upper end of the bellows 60 is coupled to the member 62 to seal the inner space of the bellows 60. In addition, a lower end of the bellows 60 is coupled to the upper end portion of the member 66. By the bellows 60, the spline shaft 54, the spline bearing 56, and the spring member 58 may be installed in the space outside the process chamber 12 which is separated from the inner space of the process chamber 12.

In one embodiment, the processing apparatus 10 further includes an actuator 70. The actuator 70 is installed outside the process chamber 12. The actuator 70 is configured to move the spline shaft 54 downward. In one embodiment, the actuator 70 may be a power cylinder, for example, an air cylinder, and has a piston rod 70a. The piston rod 70a extends in the vertical direction. An upper end of the piston rod 70a is coupled to the lower portion 68c of the housing 68 (the bottom of the housing body 68a).

In one embodiment, the processing apparatus 10 further includes a controller (MCU). The controller (MCU) is a computer device including a processor and a storage part such as a memory. The controller (MCU) can control respective parts of the processing apparatus 10, for example, the drive device 24 and the actuator 70, based on programs and process recipes stored in the storage part.

Next, an operation of the processing apparatus 10 from when the workpiece WP is loaded into the process chamber 12 until when the workpiece WP is processed will be described with reference to FIGS. 3 to 6, in addition to FIG. 1. In the following descriptions, although the operation of the processing apparatus 10 will be described to be controlled by the controller (MCU), the operation of the processing apparatus 10 is not necessarily controlled by the controller (MCU). Further, in the following descriptions, although a vertical position of the stage 16 will be described, the vertical position may be a vertical position in the upper surface of the stage 16.

As shown in FIG. 1, when the workpiece WP is loaded into the process chamber 12, the stage 16 is located at a first position below the predetermined position in the vertical direction such that the plurality of lift pins 50 can be located at a position not interfering with the workpiece WP and the transfer device. The controller (MCU) controls the drive device 24 to locate the stage 16 at the first position. When the stage 16 is installed at the first position, the lower end of the convex portion 16e of the stage 16 is brought into contact with the support part 52. In addition, in this state, the upper ends of the plurality of lift pins 50 protrude from the upper surface of the stage 16. Further, the plurality of lift pins 50 is biased upward by the spring member 58 through the spline shaft 54 and the support part 52.

Thereafter, the gate valve GV is opened and the workpiece WP is transferred into the process chamber 12 by the transfer device. Here, the upper ends of the plurality of lift pins 50 are located below the lower surface of the workpiece WP.

Figure 3:
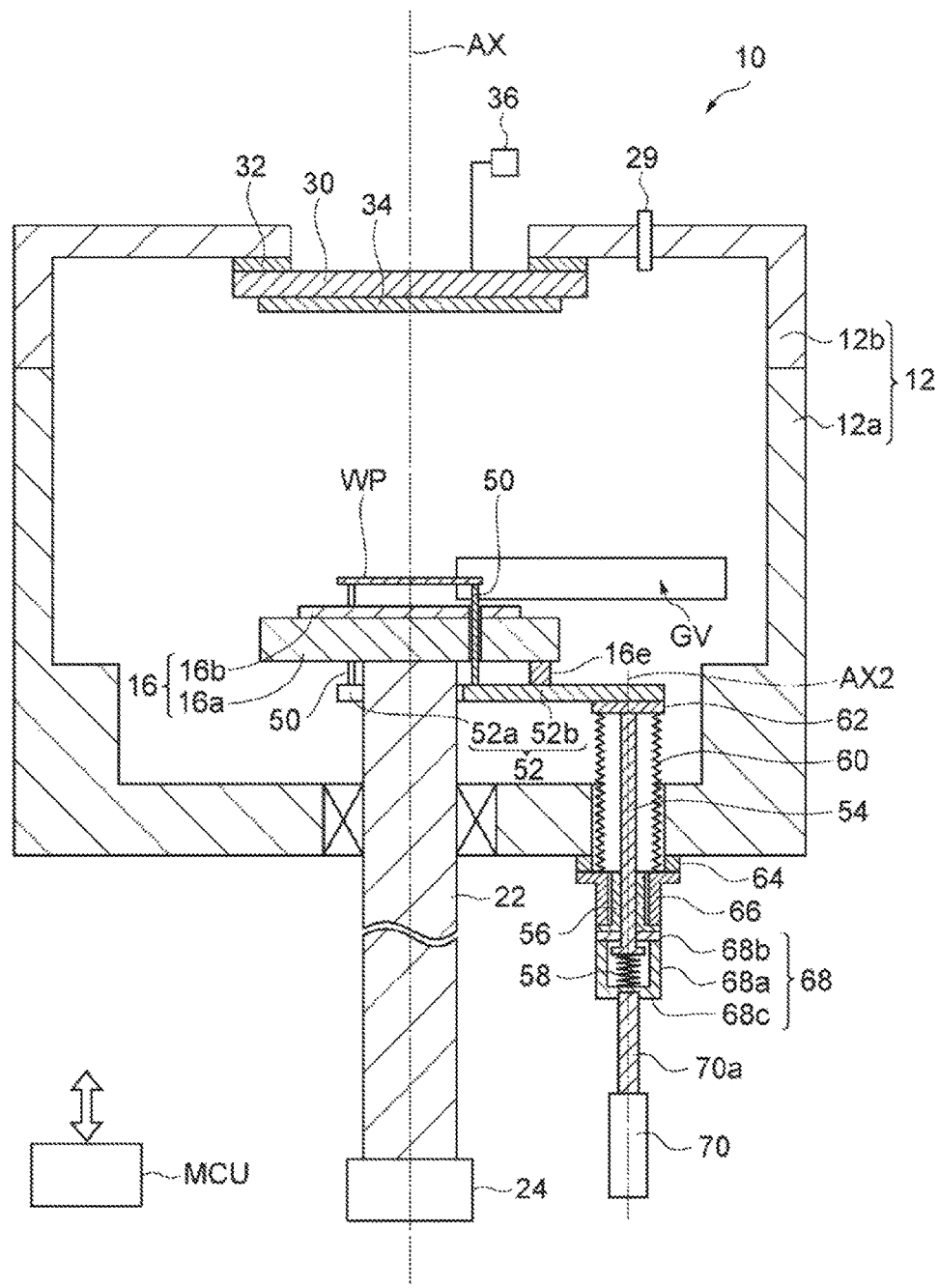
FIG. 3 is a schematic view of the processing apparatus according to the embodiment.

Subsequently, as shown in FIG. 3, the stage 16 is located at a second position defined between the predetermined position and the first position in the vertical direction such that the upper ends of the plurality of lift pins 50 are brought into contact with the lower surface of the workpiece WP. The controller (MCU) controls the drive device 24 to move the stage 16 from the first position to the second position. Since the spline shaft 54 is biased upward by the spring member 58, the plurality of lift pins 50 is also moved along with the stage 16 when the stage 16 is moved from the first position to the second position. Thus, even when the stage 16 is located at the second position, the upper ends of the plurality of lift pins 50 protrude from the upper surface of the stage 16. Further, the plurality of lift pins 50 is biased upward by the spring member 58 through the spline shaft 54 and the support part 52. In addition, even when the stage 16 is located at the second position, the lower end of the convex portion 16e is in contact with the support part 52. In this state, the workpiece WP is transferred onto the plurality of lift pins 50 from the transfer device.

Figure 4:
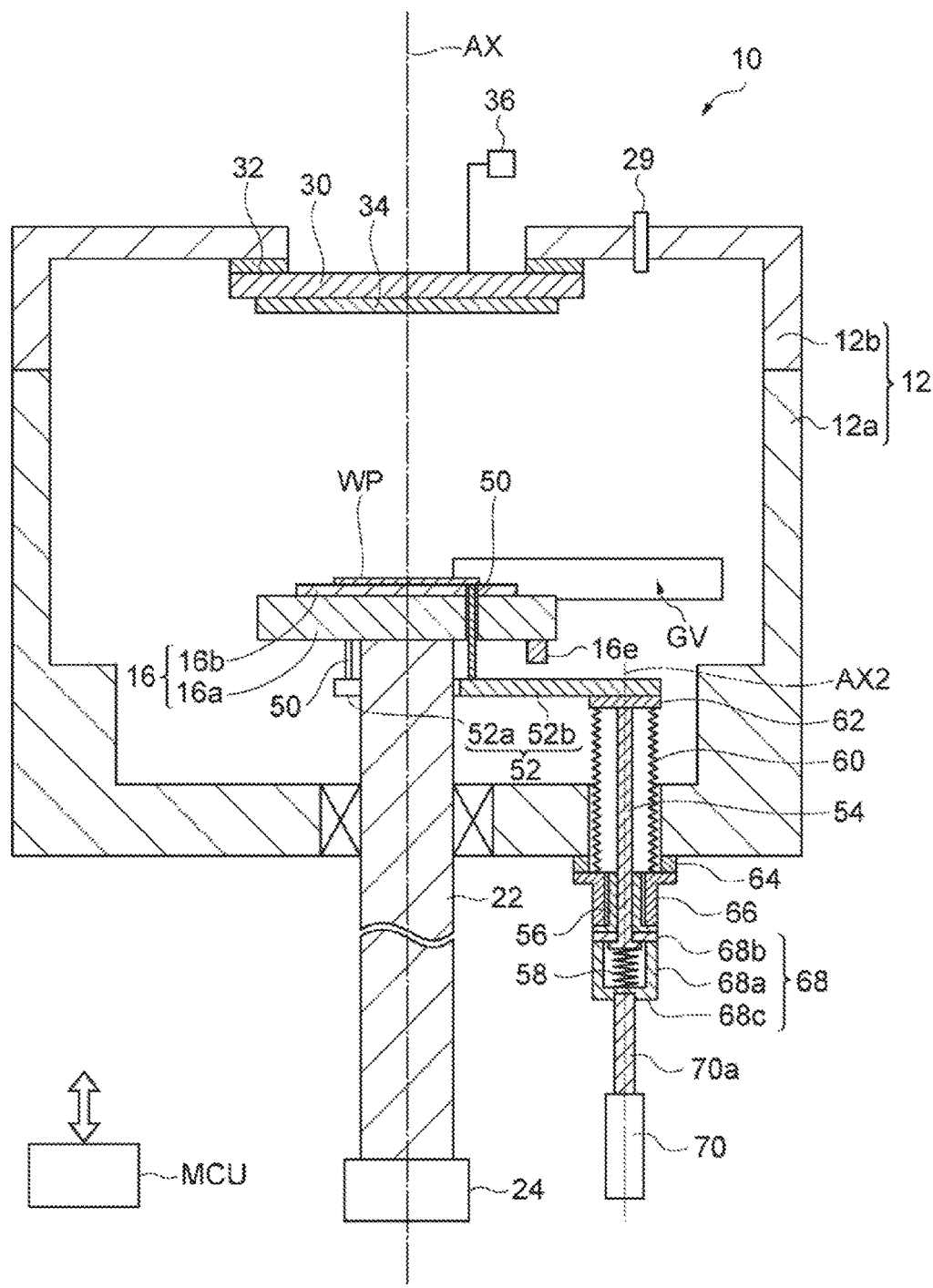
FIG. 4 is a schematic view of the processing apparatus according to the embodiment.

Subsequently, as shown in FIG. 4, the stage 16 is located at a predetermined position in the vertical direction. The controller (MCU) controls the drive device 24 to move the stage 16 from the second position to the predetermined position. During movement of the stage 16 from the second position to the predetermined position, the upward movement of the spline shaft 54 is stopped by the aforementioned limiting part. Thus, as the stage 16 is moved from the second position to the predetermined position, the lower end of the convex portion 16e of the stage 16 is spaced away from the support part 52 in an upward direction. In addition, the position of the upper ends of the plurality of lift pins 50 is lowered with respect to the upper surface of the stage 16. When the stage 16 is located at the predetermined position, the upper ends of the plurality of lift pins 50 are located at the same position as the upper surface of the stage 16 or below the upper surface of the stage 16, such that the upper surface of the stage 16 is brought into contact with the lower surface of the workpiece WP. As a result, the workpiece WP is transferred from the upper ends of the plurality of lift pins 50 to the upper surface of the stage 16. Thereafter, the workpiece WP is adsorbed to the electrostatic chuck 16b of the stage 16.

Figure 5:
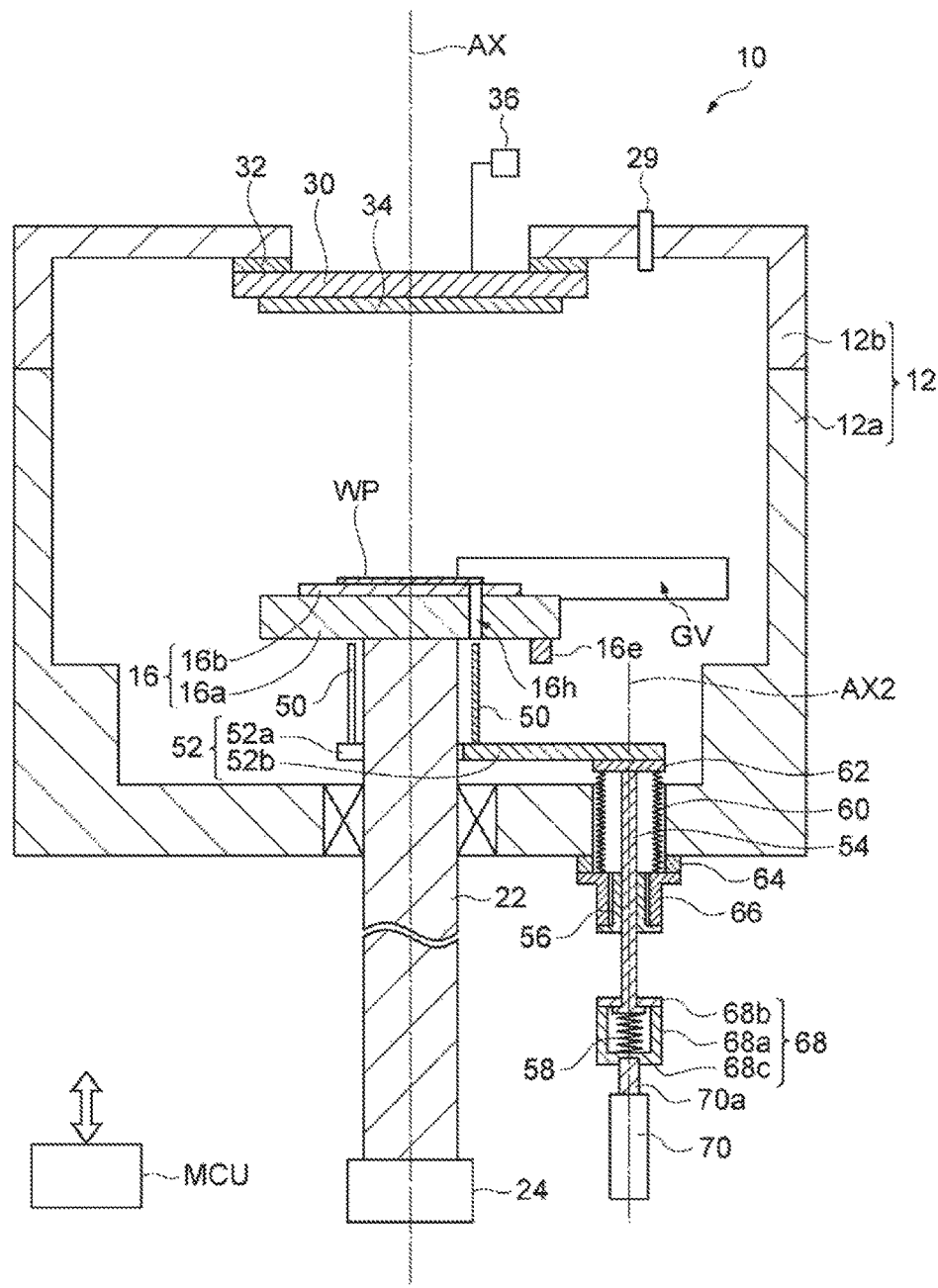
FIG. 5 is a schematic view of the processing apparatus according to the embodiment.

Thereafter, as shown in FIG. 5, the spline shaft 54 is moved downward to move the plurality of lift pins 50 to a position where the plurality of lift pins 50 does not interfere with the stage 16. To do this, the actuator 70 is controlled by the controller (MCU). Thus, the plurality of lift pins 50 is located below the lower surface of the stage 16.

Figure 6:
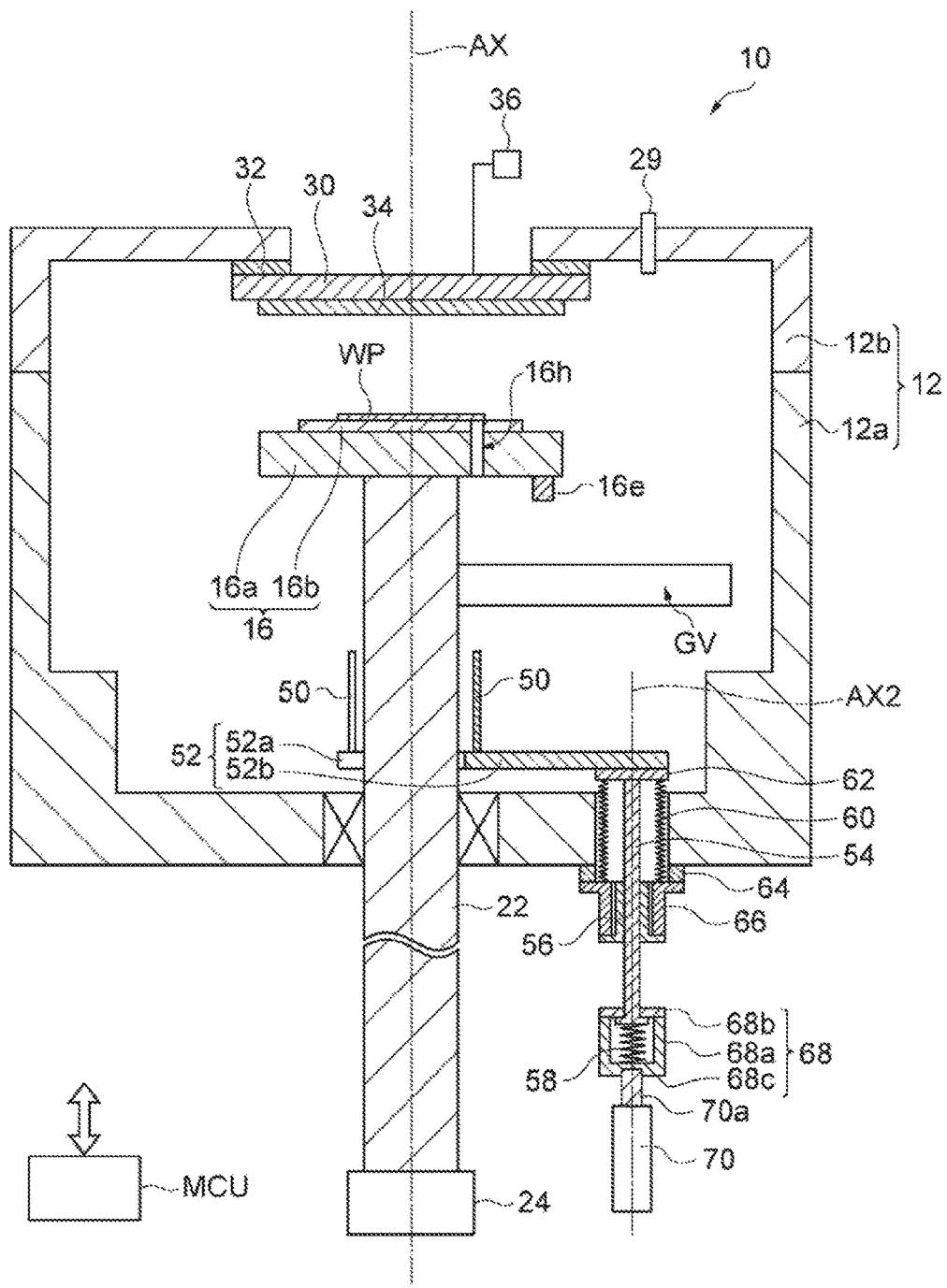
FIG. 6 is a schematic view of the processing apparatus according to the embodiment.

Subsequently, as shown in FIG. 6, the stage 16 is moved to a third position above the predetermined position in the vertical direction so as to process the workpiece WP. To do this, the drive device 24 is controlled by the controller (MCU). Thus, the stage 16 is moved to the third position.

Thereafter, at the third position, the stage 16 is rotated. To do this, the drive device 24 is controlled by the controller (MCU). As described above, since the plurality of lift pins 50 is located below the lower surface of the stage 16, the stage 16 can rotate without being affected by the plurality of lift pins 50.

Subsequently, the workpiece WP is processed. For example, the gas supply part 29 supplies a gas into the process chamber 12, and the power supply 36 applies voltage to the holder 30. As a result, a substance emitted from the target 34 is deposited on the workpiece WI thus forming a film on the workpiece WP.

In the processing apparatus 10, the plurality of lift pins 50 is supported by the spline bearing 56 through the support part 52 and the spline shaft 54. In addition, the vertical movement of the plurality of lift pins 50 is achieved by guiding the spline shaft 54 with the spline bearing 56. Thus, according to the processing apparatus 10, it is possible to suppress clattering of the stage 16 by the plurality of lift pins 50 and to improve accuracy of the vertical movement of the plurality of lift pins 50. Further, the plurality of lift pins 50 is configured to move with the movement of the stage 16 by the drive device 24 such that the plurality of lift pins 50 receive the workpiece WP at the upper ends thereof. Thus, the actuator 70 is not used in moving the plurality of lift pins 50. This increases accuracy of the movement of the plurality of lift pins 50 when receiving the workpiece WP at the upper ends thereof. Moreover, in a state when the upper ends of the plurality of lift pins 50 protrude upward from the upper surface of the stage 16, the upward movement of the plurality of lift pins 50 from the upper surface of the stage 16 is restricted by the aforementioned restriction mechanism (the combination of the convex portion 16e and the support part 52). Further, a force tending to bias the plurality of lift pins 50 upward is applied to the spline shaft 54. In this state, even when the workpiece WP is mounted on the upper ends of the plurality of lift pins 50, the positions of the plurality of lift pins 50 are not changed. When the stage 16 is moved above the predetermined position, the upward movement of the spline shaft 54 is limited by the limiting part so that the upper ends of the plurality of lift pins 50 is located below the upper surface of the stage 16. Thus, the workpiece WP is transferred to the stage 16 from the plurality of lift pins 50. It is therefore possible to suppress change in position of the workpiece WP in the course of mounting the workpiece WP on the stage 16. Therefore, with the processing apparatus 10, the workpiece WP can be transferred on the stage 16 with a high degree of accuracy. In addition, the spline shaft 54, the spline bearing 56, and the spring member 58 are disposed in the space outside the process chamber 12. which is separated from the inner space of the process chamber 12. Thus, it is possible to suppress generation of particles, which are caused by moving the plurality of lift pins 50 with respect to the stage 16.

Next, a processing apparatus 10A according to another embodiment will be described. FIG. 7 is a schematic view of the processing apparatus 10A according to this embodiment. In FIG. 7, a stage 16 of the processing apparatus 10A is shown to be located at the same position as that of the stage 16 shown in FIG. 3. As shown in FIG. 7, the processing apparatus 10A is different from the processing apparatus 10 in that the stage 16 does not include the convex portion 16e. In addition, the processing apparatus 10A is different from the processing apparatus 10 in that the processing apparatus 10A further includes a first member 80 and a second member 82. The first member 80 and the second member 82 constitute a restriction mechanism according to another embodiment.

The first member 80 is coupled to a shaft 22 and extends from the shaft 22 toward the axis line AX2. In some embodiments, the first member 80 may be indirectly coupled to the shaft 22 without being directly coupled to the shaft 22. In other words, the first member 80 may be coupled to the shaft 22 through any number of members as long as the first member 80 can be moved along with the shaft 22 (or the stage 16) without causing a position change of the first member 80 with respect to the shaft 22 (or the stage 16).

The second member 82 is coupled to a spline shaft 54 and extends a position under the first member 80. In one embodiment, one end of the second member 82 is fixed to the flange of the lower end portion of the spline shaft 54 and extends a position under the first member 80 through an opening formed in the housing 68. In some embodiments, the second member 82 may be indirectly coupled to the spline shaft 54 without being directly coupled to the spline shaft 54. That is to say, the second member 82 may be coupled to the spline shaft 54 through any number of members as long as the second member 82 can be moved along with the spline shaft 54 without causing a position change of the second member 82 with respect to the spline shaft 54.

The second member 82 is configured to be brought into contact with the first member 80. In one embodiment, the other end of the second member 82 extends a position under the first member 80 such that the other end of the second member 82 is brought into contact with the first member 80. The first member 80 and the second member 82 constitute the restriction mechanism of the processing apparatus 10A. That is to say, in a state where the upper end of each of the plurality of lift pins 50 protrudes from the upper surface of the stage 16, when the second member 82 is brought into contact with the first member 80 from below, the upward movement of the plurality of lift pins 50 from the upper surface of the stage 16 is restricted. Thus, even when the workpiece WP is mounted on the upper ends of the plurality of lift pins 50 by cooperation between the restriction mechanism and the spring member 58, the positions of the plurality of lift pins 50 are not changed. As described above, in the processing apparatus 10A, the first member 80 and the second member 82 constituting the restriction mechanism are installed outside the process chamber 12. It is therefore possible to further suppress particles from being generated, as compared with the processing apparatus 10.

While different embodiments have been described above, the present invention is not limited to these embodiments but may be configured in many modified forms. As an example, although the processing apparatus 10 and the processing apparatus 10A shown in FIGS. 1 and 7 have been described to be used as a film formation apparatus, the stage 16, a configuration in which the stage 16 moves in the vertical direction and rotates, and the lift mechanism for the workpiece WP may be used in an apparatus which performs a process other than the film formation in a depressurized space. In other words, the processing apparatus according to the present disclosure is not limited to a film formation apparatus. Although, in the processing apparatus 10, the convex portion 16e of the stage 16 is configured to be brought into contact with the support part 52, the stage 16 may be configured to be brought into contact with the support part 52 at any portion as long as the degree to which the plurality of lift pins 50 protrude from the upper surface of the stage 16 can be controlled.

According to the present disclosure in some embodiments, it is possible to suppress generation of particles, which is caused by moving a plurality of lift pins with respect to a stage of a processing apparatus, and to improve accuracy of transferring a workpiece on the stage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus of processing a workpiece in a depressurized space, comprising:
   a process chamber having a depressurizable inner space;
   a stage configured to be vertically movable inside the process chamber and having a plurality of through-holes formed to penetrate from an upper surface up to a lower surface of the stage;
   a support body installed under the stage;
   a plurality of lift pins supported by the support body and extending upward from the support body, the plurality of lift pins being aligned with the plurality of through-holes, respectively, in a vertical direction;
   a spline shaft configured to extend in the vertical direction and supporting the support body thereon;
   a spline bearing configured to support the spline shaft such that the spline shaft is vertically moved;
   a spring member configured to bias the spline shaft upward;
   a vertically-extendible bellows configured to surround the spline shaft inside the process chamber and isolate the depressurizable inner space of the process chamber from an outer space of the process chamber including an inner space of the bellows;
   a restriction mechanism configured to restrict an upward movement of the plurality of lift pins from the upper surface of the stage, when an upper end of each of the plurality of lift pins protrudes from the upper surface of the stage; and
   a limiting part configured to limit an upward movement of the spline shaft when the stage is located at at least a predetermined position in the vertical direction or above the predetermined position,
   wherein the spline shaft, the spline bearing, and the spring member are installed in the outer space of the process chamber,
   the stage includes a convex portion spaced from the plurality of through holes and formed to extend downward from the lower surface of the stage,
   a lower end of the convex portion of the stage is configured to be brought into contact with the support body, and
   the restriction mechanism includes a combination of the convex portion of the stage and the support body.

2. The processing apparatus of claim 1, further comprising:

a shaft coupled to the stage and configured to extend downward from the lower surface of the stage; and a drive device connected to the shaft outside the process chamber and configured to vertically move the stage and to rotate the stage around a central axis of the stage through the shaft.

3. The processing apparatus of claim 2, further comprising:

an actuator installed in the outer space of the process chamber and configured to move the spline shaft downward.

4. The processing apparatus of claim 3, further comprising:

a controller configured to control the drive device and the actuator, wherein, when the workpiece is loaded into the process chamber, the controller controls the drive device to place the stage at a first position below the predetermined position, the controller controls the drive device to place the stage at a second position defined between the first position and the predetermined position so as to mount the workpiece on the plurality of lift pins, the controller controls the drive device to place the stage at the predetermined position so as to mount the workpiece on the stage, the controller controls the actuator to move the plurality of lift pins to a position where the plurality of lift pins does not interfere with the stage, the controller controls the drive device to place the stage at a third position above the predetermined position, and controls the drive device to rotate the stage at the third position.

5. The processing apparatus of claim 3, further comprising:

a housing configured to receive the spring member, wherein the housing includes an upper portion having an opening formed therein and through which the spline shaft passes, and a lower portion formed to extend below the upper portion, the spline shaft includes an upper end portion coupled to the support body and a lower end portion having a flange formed therein, the lower end portion of the spline shaft is received in the housing, the spring member is installed between the flange and the lower portion of the housing, and the upper portion of the housing faces the flange and constitutes the limiting part.

6. The processing apparatus of claim 5, wherein the actuator is a power cylinder equipped with a piston rod which is coupled to the lower portion of the housing.

7. The processing apparatus of claim 2, wherein the support body comprises a first portion having a horseshoe shape and configured to support the plurality of lift pins and a second portion configured to extend from the first portion toward a sidewall of the process chamber, the first portion of the support body is configured to surround the shaft, and the spline shaft is coupled to the second portion of the support body.

8. A processing apparatus of processing a workpiece in a depressurized space, comprising:

a process chamber having a depressurizable inner space;

a stage configured to be vertically movable inside the process chamber and having a plurality of through-holes formed to penetrate from an upper surface up to a lower surface of the stage;

a support body installed under the stage;

a plurality of lift pins supported by the support body and extending upward from the support body, the plurality of lift pins being aligned with the plurality of through-holes, respectively, in a vertical direction;

a spline shaft configured to extend in the vertical direction and supporting the support body thereon;

a spline bearing configured to support the spline shaft such that the spline shaft is vertically moved;

a spring member configured to bias the spline shaft upward;

a vertically-extendible bellows configured to surround the spline shaft inside the process chamber and isolate the depressurizable inner space of the process chamber from an outer space of the process chamber including an inner space of the bellows;

a restriction mechanism configured to restrict an upward movement of the plurality of lift pins from the upper surface of the stage, when an upper end of each of the plurality of lift pins protrudes from the upper surface of the stage;

a limiting part configured to limit an upward movement of the spline shaft when the stage is located at at least a predetermined position in the vertical direction or above the predetermined position;

a shaft coupled to the stage and configured to extend downward from the lower surface of the stage; and a drive device connected to the shaft outside the process chamber and configured to vertically move the stage and to rotate the stage around a central axis of the stage through the shaft, wherein the spline shaft, the spline bearing, and the spring member are installed in the outer space of the process chamber, and the restriction mechanism includes:

a first member coupled to the shaft; and a second member coupled to the spline shaft and configured to extend a position under the first member, at which the second member is brought into contact with the first member.

9. The processing apparatus of claim 8, further comprising:

an actuator installed in the outer space of the process chamber and configured to move the spline shaft downward.

10. The processing apparatus of claim 9, further comprising:

a controller configured to control the drive device and the actuator, wherein, when the workpiece is loaded into the process chamber, the controller controls the drive device to place the stage at a first position below the predetermined position, the controller controls the drive device to place the stage at a second position defined between the first position and the predetermined position so as to mount the workpiece on the plurality of lift pins, the controller controls the drive device to place the stage at the predetermined position so as to mount the workpiece on the stage, the controller controls the actuator to move the plurality of lift pins to a position where the plurality of lift pins does not interfere with the stage, the controller controls the drive device to place the stage at a third position above the predetermined position, and controls the drive device to rotate the stage at the third position.

11. The processing apparatus of claim 9, further comprising:

a housing configured to receive the spring member, wherein the housing includes an upper portion having an opening formed therein and through which the spline shaft passes, and a lower portion formed to extend below the upper portion, the spline shaft includes an upper end portion coupled to the support body and a lower end portion having a flange formed therein, the lower end portion of the spline shaft is received in the housing, the spring member is installed between the flange and the lower portion of the housing, and the upper portion of the housing faces the flange and constitutes the limiting part.

12. The processing apparatus of claim 11, wherein the actuator is a power cylinder equipped with a piston rod which is coupled to the lower portion of the housing.

13. The processing apparatus of claim 8, wherein the support body comprises a first portion having a horseshoe shape and configured to support the plurality of lift pins and a second portion configured to extend from the first portion toward a sidewall of the process chamber, the first portion of the support body is configured to surround the shaft, and the spline shaft is coupled to the second portion of the support body.

* * * * *